US012696640B2

(12) United States Patent
Li et al.

(10) Patent No.: US 12,696,640 B2
(45) Date of Patent: Jul. 28, 2026

(54) DISPLAY PANEL AND DISPLAY APPARATUS WITH DRIVING UNITS CONNECTED BY TRANSPARENT CONDUCTING WIRE

(71) Applicant: Hefei Visionox Technology Co., Ltd., Hefei (CN)

(72) Inventors: Hongrui Li, Hefei (CN); Lei Mi, Hefei (CN); Hongqing Feng, Hefei (CN); Rubo Xing, Hefei (CN); Xiangtao Zeng, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 452 days.

(21) Appl. No.: 18/342,071

(22) Filed: Jun. 27, 2023

(65) Prior Publication Data

US 2023/0337494 A1      Oct. 19, 2023

Related U.S. Application Data

(63) Continuation of application No. PCT/CN2021/140167, filed on Dec. 21, 2021.

(30) Foreign Application Priority Data

Mar. 31, 2021    (CN) .......................... 202110349005.5
Nov. 19, 2021    (CN) .......................... 202111408281.0

(51) Int. Cl.
*H10K 59/131*        (2023.01)
*H10K 59/123*        (2023.01)
(52) U.S. Cl.
CPC ......... *H10K 59/131* (2023.02); *H10K 59/123* (2023.02)

(58) Field of Classification Search
CPC ........................... H10K 59/131; H10K 59/123
See application file for complete search history.

(56) References Cited

U.S. PATENT DOCUMENTS

2008/0174712 A1    7/2008  Kim et al.
2009/0152564 A1    6/2009  Wang et al.
(Continued)

FOREIGN PATENT DOCUMENTS

CN        110109305 A      8/2019
CN        110634930 A      12/2019
(Continued)

OTHER PUBLICATIONS

English translation of CN-112310325-A (Year: 2021).*
(Continued)

*Primary Examiner* — Lex H Malsawma
(74) *Attorney, Agent, or Firm* — Maier & Maier, PLLC

(57)          ABSTRACT

A display panel and a display apparatus. The display panel includes: a substrate; a driving layer arranged on the substrate and including a plurality of driving units; a first electrode layer arranged on a side of the driving layer away from the substrate and including a plurality of pixel electrodes distributed in an array, each of the driving units being electrically connected to at least one of the pixel electrodes, at least a part of an orthographic projection of at least a part of the driving units on the substrate being located within an orthographic projection of the pixel electrodes on the substrate; a first signal line layer arranged between the first electrode layer and the substrate and including a plurality of first transparent conducting wires, at least two of the driving units being connected to each other by the first transparent conducting wire.

17 Claims, 12 Drawing Sheets

(56)          References Cited

U.S. PATENT DOCUMENTS

2015/0206929 A1 *   7/2015   Sato ...................... H10K 59/35
                                                257/40
2022/0069047 A1 *   3/2022   Yang ................... H10K 59/131

FOREIGN PATENT DOCUMENTS

| | | | | |
|---|---|---|---|---|
| CN | 110767720 | A | | 2/2020 |
| CN | 110783386 | A | | 2/2020 |
| CN | 110783390 | A | | 2/2020 |
| CN | 110914891 | A | | 3/2020 |
| CN | 111831240 | A | | 10/2020 |
| CN | 111899648 | A | | 11/2020 |
| CN | 111916486 | A | | 11/2020 |
| CN | 112130371 | A | | 12/2020 |
| CN | 112310325 | A * | 2/2021 | ............ H10K 59/12 |
| CN | 113053988 | A | | 6/2021 |

OTHER PUBLICATIONS

Office Action issued on Mar. 28, 2025, in corresponding Chinese
Application No. 202111408281.0, 11 pages.
International Search Report issued on Mar. 22, 2022, in correspond-
ing International Application No. PCT/CN2021/140167, 5 pages.

* cited by examiner

| | |
|---|---|
| Cathode | 900 |
| PDL | 800 |
| Anode | 300 |
| PLN | 700 |
| PEP4-M2 | 202 |
| PEP3-ITO1 | 400 |
| PEP2-M1 | 201 |
| PEP1-PSI | |
| PI | 100 |

DISPLAY PANEL AND DISPLAY APPARATUS WITH DRIVING UNITS CONNECTED BY TRANSPARENT CONDUCTING WIRE

CROSS-REFERENCE TO RELATED APPLICATIONS

The present application is a continuation of International Application No. PCT/CN2021/140167 filed on Dec. 21, 2021, which claims the benefit of priority to Chinese Patent Application No. 202111408281.0 filed on Nov. 19, 2021 and Chinese Patent Application No. 202110349005.5 filed on Mar. 31, 2021, all of which are incorporated herein by reference in their entireties.

TECHNICAL FIELD

The present application relates to the field of display technology, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer need to integrate a front camera, a telephone receiver, an infrared sensing component and the like. In the prior art, a notch or a hole may be formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

SUMMARY

Embodiments of the present application provide a display panel and a display apparatus, and at least a part of the display panel can be light-transmitting and can be used to display, facilitating the integration of a photosensitive component under the screen.

The embodiments of a first aspect of the present application provide a display panel including: a substrate; a driving layer arranged on the substrate and including a plurality of driving units; a first electrode layer arranged on a side of the driving layer away from the substrate and including a plurality of pixel electrodes distributed in an array, each of the driving units being electrically connected to at least one of the pixel electrodes, and at least a part of an orthographic projection of at least a part of the driving units on the substrate being located within an orthographic projection of the pixel electrodes on the substrate; and a first signal line layer arranged between the first electrode layer and the substrate and including a plurality of first transparent conducting wires, and at least two of the driving units being connected to each other by the first transparent conducting wire.

The embodiments of a second aspect of the present application provide a display apparatus including the display panel of the above implementation.

The display panel according to the embodiments of the present application includes a substrate, a driving layer including a plurality of driving units, a first electrode layer including pixel electrodes, and a first signal line layer, and each of the driving units is connected to at least one of the pixel electrodes and drives the display panel to emit light. The orthographic projection of at least a part of the driving units on the substrate is located within an orthographic projection of the pixel electrodes on the substrate, the light transmittance of the entire display panel can be increased. The first signal line includes a plurality of first transparent conducting wires, and at least two of the driving units are connected to each other by the first transparent conducting wire, the light transmittance of the display panel can be further increased, facilitating the under-screen integration for the photosensitive component.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features, and the accompanying drawings are not drawn to actual scale.

DETAILED DESCRIPTION

Features and exemplary embodiments of various aspects of the present application will be described in detail below. To make the objects, technical solutions and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

In an electronic device such as a cell phone or a tablet computer, a photosensitive component such as a front camera, an infrared light sensor, and a proximity light sensor is required to be integrated at a side of the display panel. In some embodiments, a light-transmitting display area may be arranged on the electronic device, and the photosensitive component can be arranged on the back of the light-transmitting display area to achieve a full-screen display for the electronic device while ensuring the normal operation of the photosensitive component.

In order to increase the light transmittance of the light-transmitting display area and facilitate the arrangement of driving units for sub-pixels in the light-transmitting display area, a transition display area is usually arranged around the display area and the driving units for the display area are arranged in the transition display area to increase the light transmittance of the display area, however, the existence of the transition display area will result in an obvious display boundary, the display effect of the display panel is affected.

To solve the above problems, embodiments of the present application provide a display panel and a display apparatus, which will be described below with reference to the drawings.

The embodiments of the present application provide a display panel, which may be an organic light emitting diode (Organic Light Emitting Diode, OLED) display panel.

Figure 1:
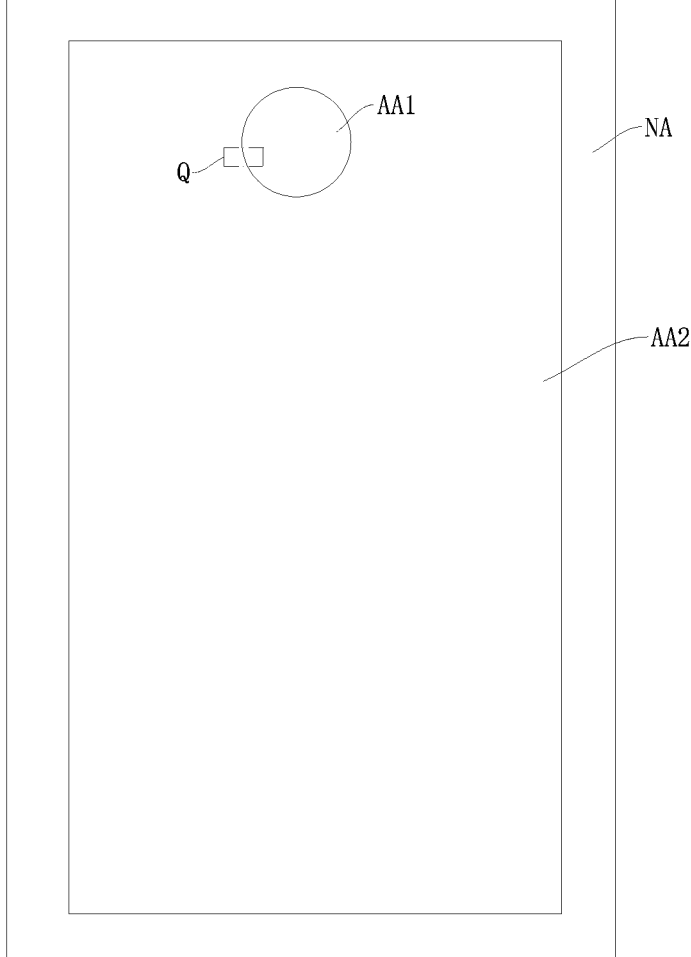
FIG. 1 shows a top view of a display panel according to an embodiment of the present application.
Figure 2:
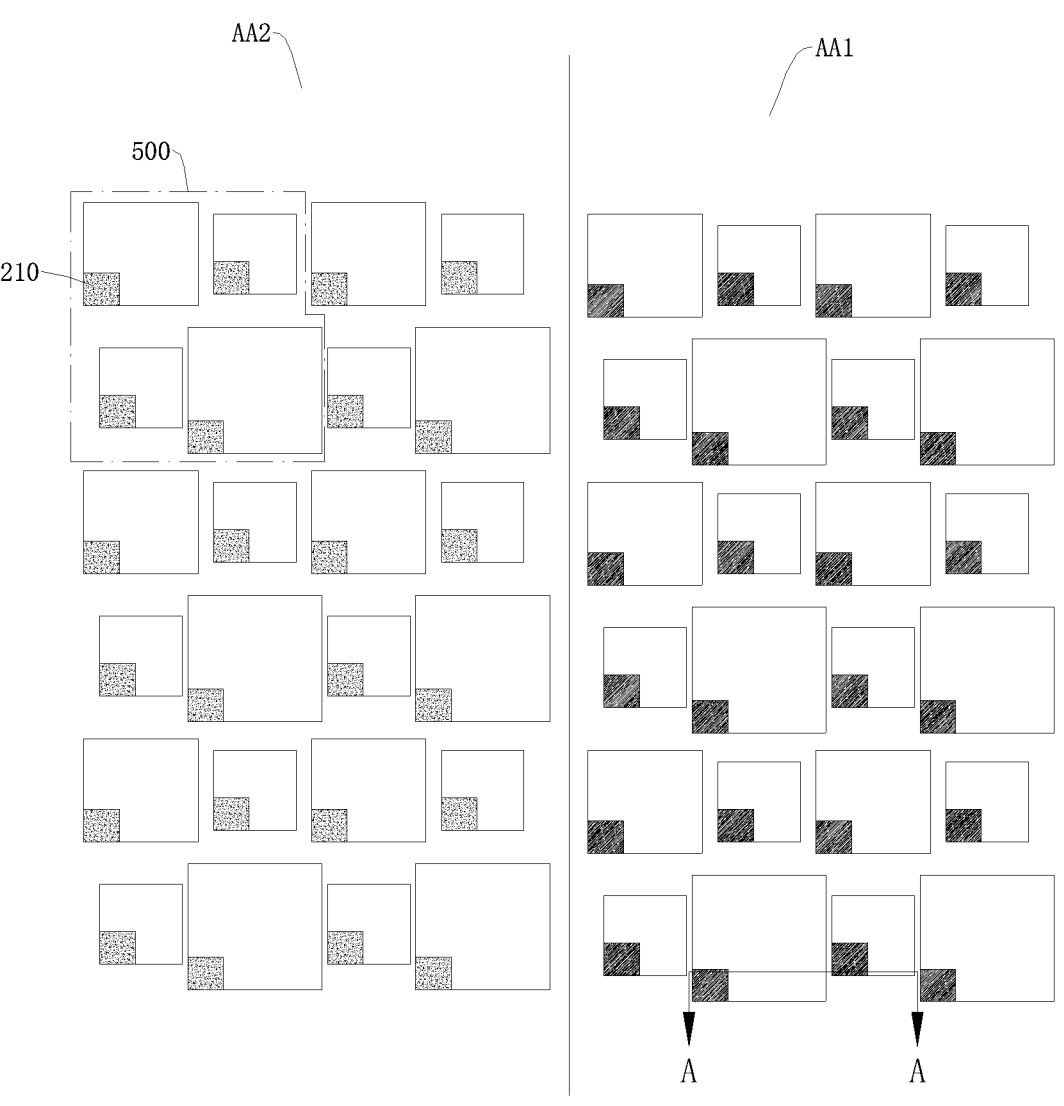
FIG. 2 shows a partial enlarged diagram of area Q in FIG. 1 in an example.

FIG. 1 shows a top view of a display panel according to an embodiment of the present application, and FIG. 2 shows a partial enlarged diagram of an area Q in FIG. 1 in an example.

The display panel 10 includes a first display area AA1, a second display area AA2, and a non-display area NA surrounding the first display area AA1 and the second display area AA2, and the light transmittance of the first display area AA1 is greater than the light transmittance of the second display area AA2.

Herein, it is preferred that the light transmittance of the first display area AA1 is greater than or equal to 15%. In order to ensure that the light transmittance of the first display area AA1 is greater than 15%, or even greater than 40%, or even a higher light transmittance, the light transmittances of various functional films of the display panel 10 in the embodiment are all greater than 80%, and even the light transmittances of at least some of the functional films are all greater than 90%.

According to the display panel 10 of the embodiments of the present application, the light transmittance of the first display area AA1 is greater than the light transmittance of the second display area AA2, so that the photosensitive component can be integrated on the rear of the first display area AA1 of the display panel 10. An under-screen integration is achieved for the photosensitive component such as a camera, and moreover, the first display area AA1 can display the image, the display area of the display panel 10 is increased and a full-screen design is achieved for the display apparatus.

Figure 3:
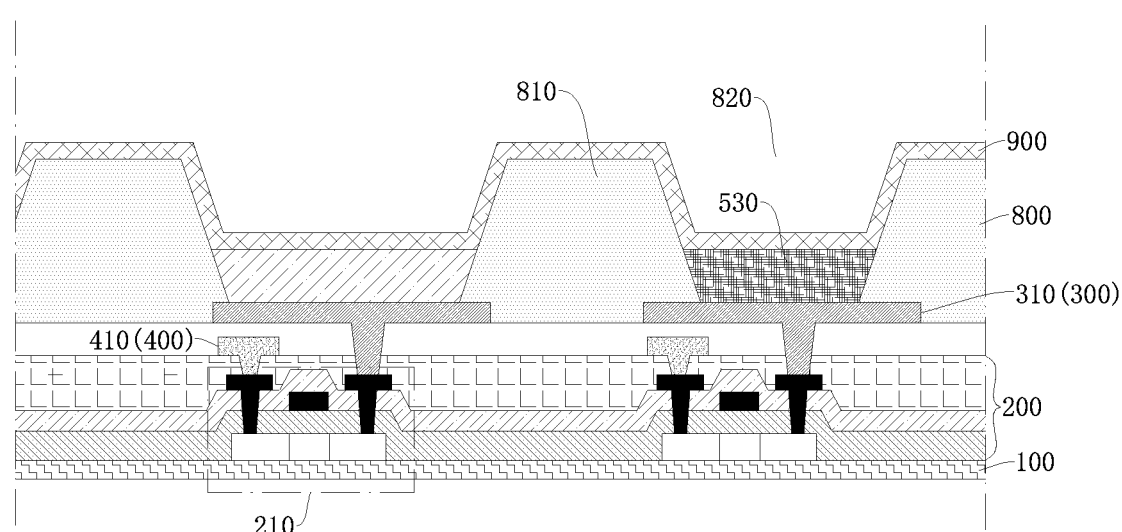
FIG. 3 shows a partial cross-sectional view at A-A in FIG. 2 in an embodiment.

Referring to FIG. 2 and FIG. 3 together, FIG. 3 shows a partial cross-sectional view at A-A in FIG. 2.

As shown in FIG. 2 and FIG. 3, the display panel 10 according to the embodiments of the present application includes: a substrate 100; a driving layer 200 arranged on the substrate 100 and including a plurality of driving units 210; a first electrode layer 300 arranged on a side of the driving layer 200 away from the substrate 100 and including a plurality of pixel electrodes 310 distributed in an array, each of the driving units 210 being electrically connected to at least one of the pixel electrodes 310, and an orthographic projection of at least a part of the driving units 210 on the substrate 100 being located within an orthographic projection of the pixel electrodes 310 on the substrate 100; and a first signal line layer 400 arranged between the first electrode layer 300 and the substrate 100 and including a plurality of first transparent conducting wires 410, and at least two of the driving units 210 being connected to each other by the first transparent conducting wire 410.

The first signal line layer 400 may be arranged in various ways, for example, the first signal line layer 400 may be arranged in the entire display area, or the first signal line layer 400 may be arranged in the first display area AA1.

The display panel 10 according to the embodiments of the present application includes the substrate 100, the driving layer 200 including a plurality of driving units 210, the first electrode layer 300 including the pixel electrodes 310, and the first signal line layer 400, the driving unit 210 is connected to at least one of the pixel electrodes 310 and drives the display panel 10 to emit light. At least a part of the orthographic projection of at least a part of the driving units 210 on the substrate 100 is located within the orthographic projection of the pixel electrodes 310 on the substrate 100, the light transmittance of the whole of the display panel 10 can be increased. The first signal line includes a plurality of first transparent conducting wires 410, and at least two of the driving units 210 are connected to each other by the first transparent conducting wire 410, so that the light transmittance of the display panel can be further increased, facilitating the under-screen integration of the photosensitive component 20.

Alternatively, the orthographic projection of at least a part of the driving units 210 falls entirely within the orthographic projection of the plurality of pixel electrodes 310 on the substrate 100, or a part of the orthographic projection of the driving unit 210 is located within the orthographic projection of the pixel electrodes 310 on the substrate 100, that is, a part of the orthographic projection of the driving units 210 does not overlap the orthographic projection of the pixel electrodes 310 on the substrate 100.

Alternatively, the orthographic projection of the plurality of driving units 210 on the substrate 100 is located within the orthographic projection of the pixel electrodes 310 on the substrate 100, so that the light transmittance of the whole of the display panel 10 is further increased.

The substrate 100 may be made of a light-transmitting material such as glass, polyimide (PI), and the like.

The driving units 210 are connected to the pixel electrodes 310 for driving the display panel 10 to display. A circuit structure of the driving unit 210 may be arranged in various ways, and may be any one of a 2T1C circuit, a 7T1C circuit, a 7T2C circuit, a 9T1C circuit, a 4T2C circuit, a 3T1C circuit and a 6T1C circuit. Herein, the "2T1C circuit" means that the driving unit 210 includes two thin film transistors (T) and one capacitor (C), and the same applies to the "7T1C circuit", the "7T2C circuit", the "9T1C circuit", the "4T2C circuit", the "3T1C circuit", the "6T1C circuit", and so on.

The first signal line layer 400 may be arranged in various ways, for example, the first signal line layer 400 may be located within the driving layer 200, or the first signal line layer 400 may be located between the driving layer 200 and the first electrode layer 300, or the first signal line layer 400 may be located between the driving layer 200 and the substrate 100.

Figure 4:
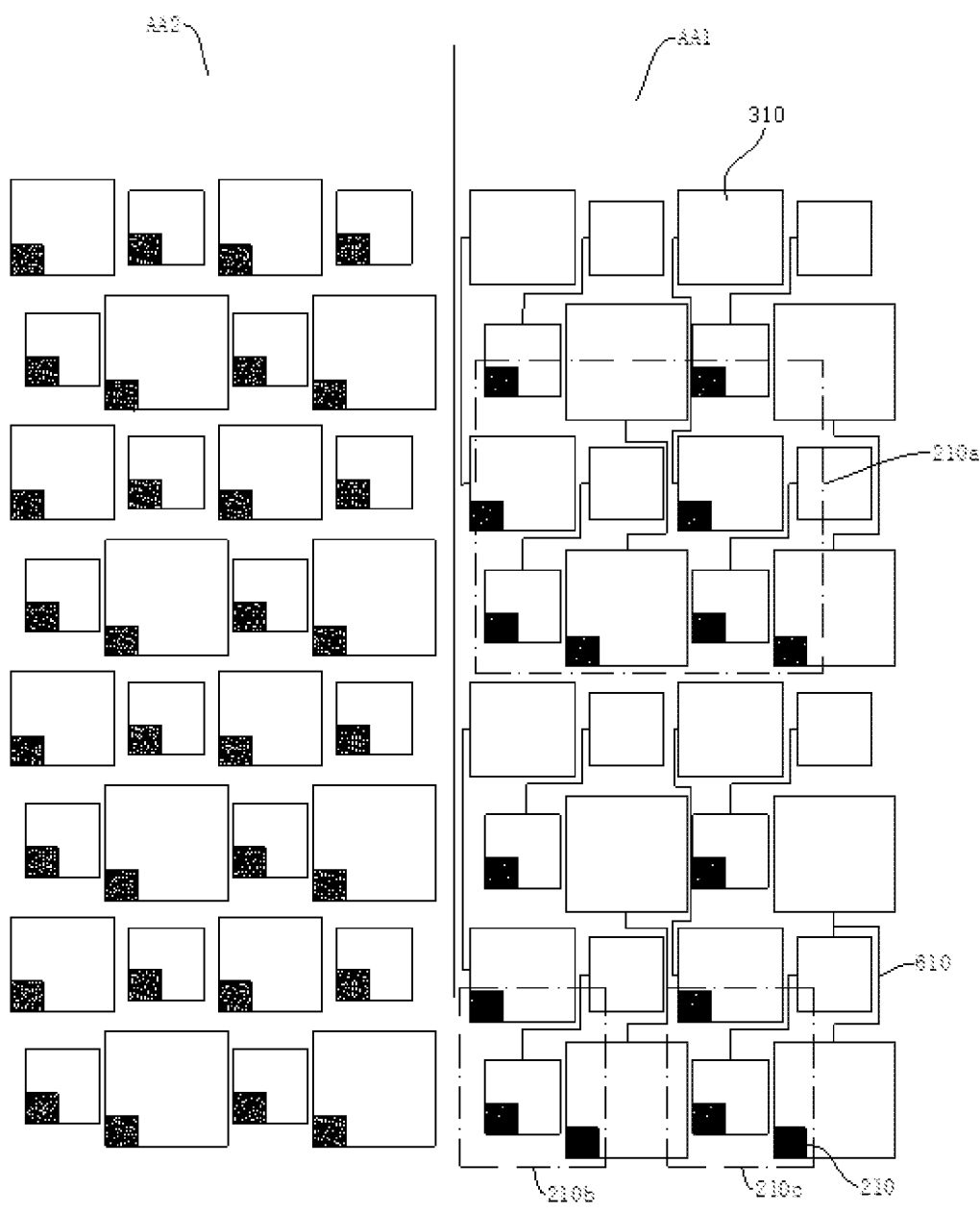
FIG. 4 shows a top view of a part of a layer structure of a display panel according to an embodiment of a first aspect of the present application.

Referring to FIG. 2 and FIG. 4, a relative positional relationship between the first electrode layer 300 and the driving unit 210 in the display panel 10 is shown in FIG. 4. In some optional embodiments, the display panel 10 includes a plurality of pixel units 500 arranged in an array, each of the pixel units 500 includes two or more sub-pixels, each of the pixel electrodes 310 is connected to a corresponding one of the sub-pixels, the driving units 210 corresponding to a plurality of sub-pixels in at least one of the pixel units 500 belong to a repeated driving group 210a, and two repeated driving groups 210a are connected to each other by the first transparent conducting wire 410. Optionally, the pixel units 500 are located in the first display area and/or the second display area.

In these optional embodiments, each of the repeated driving groups 210a includes a plurality of driving units 210, and the plurality of driving units 210 within the pixel unit 500 are configured to drive a plurality of sub-pixels within one pixel unit 500 to display. Two repeated driving groups 210a are connected to each other by the first transparent conducting wire 410, on the one hand, a higher light transmittance of the second display area can be ensured, and on the other hand, an effective information transmission for the various driving units 210 in the repeated driving group 210a can be ensured.

The sub-pixel may be arranged in various manners, for example, the sub-pixel includes a light-emitting unit 530. The light-emitting unit 530 is arranged correspondingly to the pixel electrode 310 and located at a side of the pixel electrode 310 away from the substrate 100. The display panel 10 further includes a second electrode layer 900 located at a side of the light-emitting unit 530 away from the substrate 100. The second electrode layer 900 is, for example, a common electrode layer.

The light-emitting unit 530 may be arranged in various manners, for example, the light-emitting unit 530 includes an OLED light-emitting layer, and according to design requirements, the light-emitting unit 530 may include at least one of a hole inject layer, a hole transport layer, a light-emitting layer, an electron transport layer and an electron inject layer.

Optionally, as shown in FIG. 3, the display panel 10 further includes a pixel definition layer 800 located at a side of the first electrode layer 300 away from the substrate 100. The pixel definition layer 800 includes an isolation structure 810 and a pixel opening 820 surrounded by the isolation structure 810, and the light-emitting unit 530 is located within the pixel opening 820. The pixel electrode 310 is arranged correspondingly to the pixel opening 820.

The driving layer 200 further includes a metal layer. Optionally, when the driving units 210 are located in the metal layer, since the first signal line layer 400 has a different material from the metal layer, the first signal line layer 400 is arranged on a different layer from the metal layer in which the driving units 210 are located. Then, a through hole needs to be arranged in an insulation layer between the metal layer and the first signal line layer 400 and a predetermined position needs to be reserved on the driving unit 210, so that the first transparent conducting wire 410 of the first signal line layer 400 is connected to the predetermined position by the through hole. If all of the driving units 210 are connected to each other using the first transparent conducting wire 410, more positions need to be reserved on the driving unit 210 and more through holes are required in the insulation layer, the manufacturing difficulty and the area of the metal layer are increased.

In the display panel 10 according to the embodiments of the present application, two repeated driving groups 210a are connected to each other by the first transparent conducting wire 410, and compared with a scheme in which all of the driving units 210 are connected to each other using the first transparent conducting wire 410, less through holes in the insulation layer and less predetermined positions on the driving unit 210 are sufficient to achieve the connection between the first transparent conducting wire 410 and the driving unit 210.

Optionally, the plurality of the driving units 210 in the repeated driving group 210a may be connected to each other by the conducting wire located in the metal layer, or at least two of the driving units 210 in the repeated driving group 210a may be connected to each other by the first transparent conducting wire 410.

Figure 5:
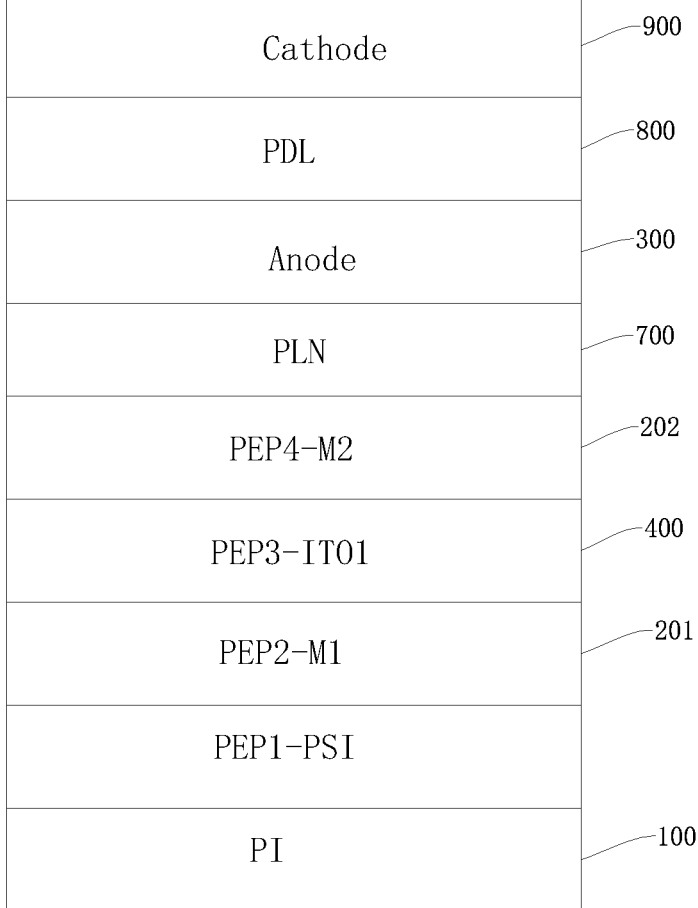
FIG. 5 shows a schematic view of a layer structure of a display panel 10 according to an embodiment of a first aspect of the present application.

Referring to FIG. 5, which shows a schematic view of a layer structure of the display panel 10 according to an embodiment of the first aspect of the present application.

The number of the metal layers may be set in various ways. Optionally, as shown in FIG. 5, the number of metal layers may be two, and the driving layer 200 includes a first metal layer 201 and a second metal layer 202 arranged in sequence along a direction away from the substrate 100. The first signal line layer 400 may be arranged in various manners, as shown in FIG. 5, for example, the first signal line layer 400 is located between the first metal layer 201 and the second metal layer 202. Alternatively, in other embodiments, the first signal line layer 400 may be located at a side of the second metal layer 202 away from the substrate 100.

Figure 6:
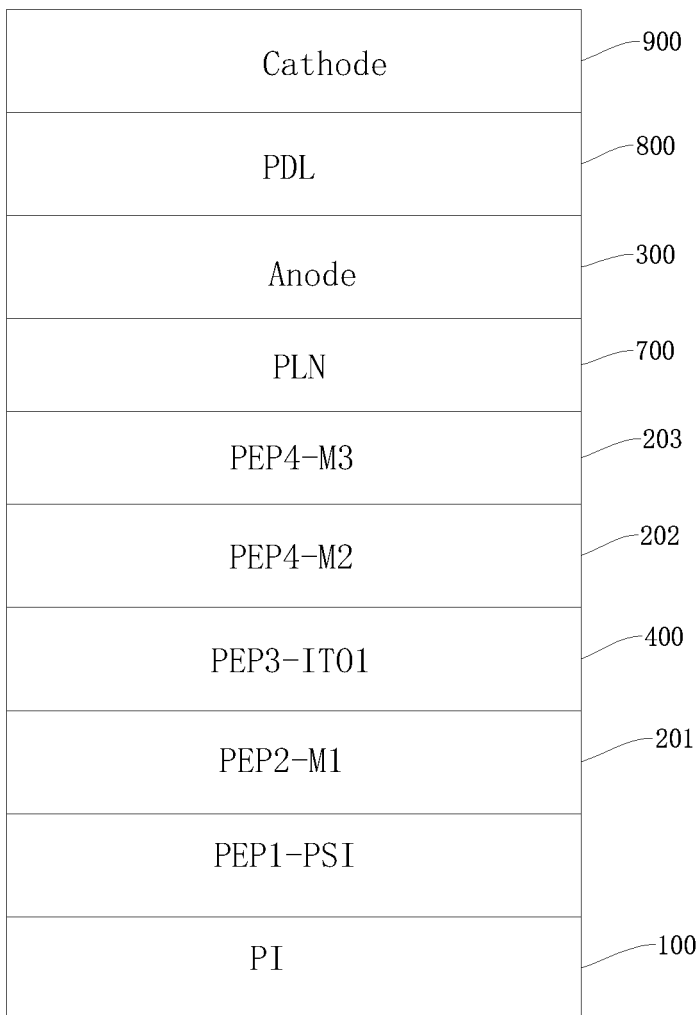
FIG. 6 shows a schematic view of a layer structure of a display panel 10 according to another embodiment of a first aspect of the present application.

Referring to FIG. 6, which shows a schematic view of a layer structure of the display panel 10 according to another embodiment of the first aspect of the present application.

In some other optional embodiments, as shown in FIG. 6, the number of metal layers may be three, the driving layer 200 includes a first metal layer 201, a second metal layer 202, and a third metal layer 203 arranged in sequence along a direction away from the substrate 100, and the first signal line layer 400 may be located between the first metal layer and the second metal layer. Alternatively, in other embodiments, the first signal line layer 400 may be located between the second metal layer and the third metal layer, or the first signal line layer 400 may be located at a side of the third metal layer away from the second metal layer.

In the display panel 10 according to the embodiments of the first aspect of the present application, as shown in FIG. 4, the driving unit 210 located in the first display area AA1 is electrically connected to two or more pixel electrodes 310 located in the first display area AA1, so that the driving unit 210 is able to drive two or more sub-pixels located in the first display area AA1 to display.

In these optional embodiments, the driving unit 210 is electrically connected to two or more pixel electrodes 310, that is, the driving unit 210 is able to drive two or more sub-pixels to display, therefore less first driving units 210 are sufficient to satisfy the driving requirements, the number of wires can be reduced and the light transmittance of the display panel can be further increased.

As shown in FIG. 4, at least a part of the pixel electrodes 310 in the first row are connected with the corresponding pixel electrodes 310 in the second row, so that one row of the driving units 210 can drive two rows of the sub-pixels to display, and thus the number of the driving units 210 can be reduced so as to increase the light transmittance of the display panel.

In some other optional embodiments, at least a part of the pixel electrodes 310 in the first column may be connected with the corresponding pixel electrodes 310 in the second column, so that one column of the first driving units 211 can drive two columns of the first pixels to display.

In yet other optional embodiments, three or more pixel electrodes 310 may be connected, so that the driving unit 210 is able to drive three or more sub-pixels to display.

In some optional embodiments, the sub-pixel includes the first light-emitting unit 530, and the pixel opening 820 includes a first pixel opening 820 for containing the first light-emitting unit 530.

In some optional embodiments, an orthographic projection of each first light-emitting unit 530 on the substrate 100 consists of one first graphic unit or two or more first graphic units jointed together, and the first graphic unit includes at least one selected from a group including a round shape, an oval shape, a dumb-bell shape, a gourd shape and a rectangle shape.

Still referring to FIG. 2 and FIG. 4, optionally, the repeated driving group 210a includes three or more driving units 210 which are combined to form a first driving block 210b and a second driving block 210c, the first driving block 210b includes at least two of the driving units 210, the second driving block 210c includes at least one of the driving unit 210 in the repeated driving group 210a other than the first driving block 210b, a distance between adjacent two of the driving units 210 in the first driving block 210b is less than a distance between the first driving block 210b and the second driving block 210c, and the first driving block 210b and the second driving block 210c are connected to each other by the first transparent conducting wire 410.

In these optional embodiments, the driving units 210 that are far away from each other are connected by the first transparent conducting wire 410, so as to further increase the light transmittance of the first display area.

Optionally, the repeated driving group 210a may further include a third driving block including at least one of the driving units 210 other than the first driving block 210b and the second driving block 210c, a distance between adjacent two of the driving units 210 in the first driving block 210b is less than a distance between the first driving block 210b and the third driving block, or a distance between adjacent two of the driving units 210 in the first driving block 210b is less than a distance between the second driving block 210c and the third driving block. The first driving block 210b and the second driving block 210c are connected to each other by the first transparent conducting wire 410, the second driving block 210c and the third driving block are connected to each other by the first transparent conducting wire 410, and the first driving block 210b and the third driving block are connected to each other by the first transparent conducting wire 410.

For example, if the pixel unit 500 includes four sub-pixels corresponding to four pixel electrodes 310, and each of the pixel electrode 310 is correspondingly connected to one driving unit 210, then one repeated driving group 210a includes four driving units 210, and distances between at least two of the four driving units 210 are different. The three driving units 210 that are close to each other are combined to form the first driving block 210b, the other driving unit 210 forms the second driving block 210c, and a distance between the first driving block 210b and the second driving block 210c is greater than a distance between two driving units 210 in the first driving block 210b, and then the first driving block 210b and the second driving block 210c are connected to each other by the first transparent conducting wire 410.

In some other optional embodiments, for example, if the pixel unit 500 includes eight sub-pixels corresponding to eight pixel electrodes 310, and the eight pixel electrodes 310 are connected to four driving units 210, that is, two pixel electrodes 310 are connected to one driving unit 210, then one repeated driving group 210a includes four driving units 210, the first driving block 210b may include two or three driving units 210, and the corresponding second driving block 210c may include two or one driving units 210.

Optionally, an orthographic projection of at least a part of the first driving blocks 210b on the substrate 100 is located within an orthographic projection of one of the plurality of pixel electrodes 310 on the substrate 100; and an orthographic projection of at least a part of the second driving blocks 210c on the substrate 100 is located within an orthographic projection of another of the plurality of pixel electrodes 310 on the substrate 100.

In these optional embodiments, the first driving block 210b and the second driving block 210c are located under different pixel electrodes 310, therefore the light transmittance of the first display area can be further increased.

Figure 7:
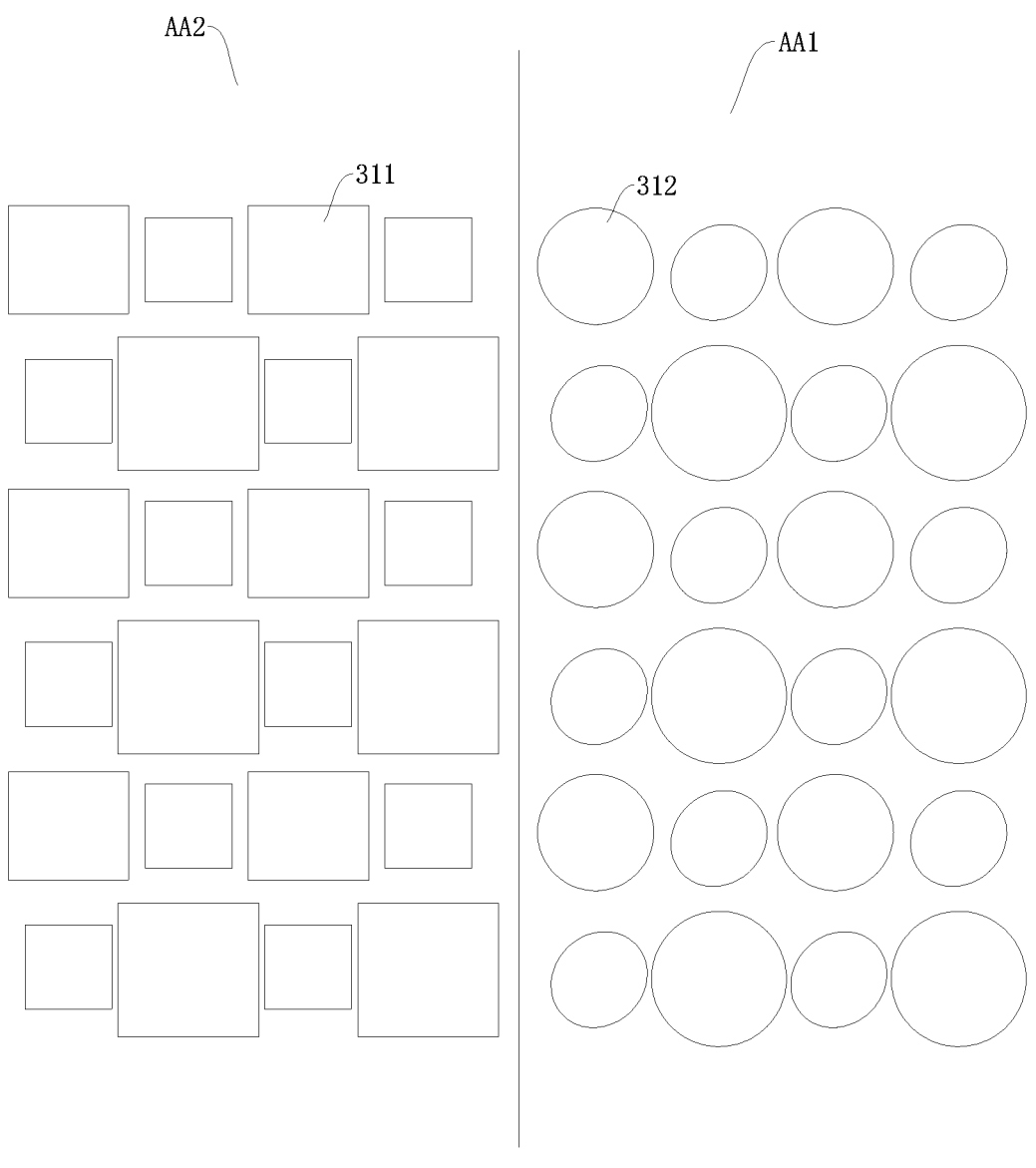
FIG. 7 shows a top view of a first electrode layer of a display panel according to an embodiment of a first aspect of the present application.

Referring to FIG. 7, which shows a top view of the first electrode layer 300 of the display panel 10 according to an embodiment of the first aspect of the present application.

According to the display panel 10 of the embodiments of the present application, an orthographic projection (312) of the pixel electrode 310 in the first display area AA1 on the substrate 100 and an orthographic projection (311) of the pixel electrode 310 in the second display area AA2 on the substrate 100 are of a same area but different shapes.

In these optional embodiments, the orthographic projection of the pixel electrode 310 in the first display area AA1 on the substrate 100 and the orthographic projection of the pixel electrode 310 in the second display area AA2 on the substrate 100 are of the same area, so as to reduce the display difference between the first display area AA1 and the second display area AA2. The orthographic projection of the pixel electrode 310 in the first display area AA1 on the substrate 100 and the orthographic projection of the pixel electrode 310 in the second display area AA2 on the substrate 100 are of different shapes, so as to reduce the diffraction phenomenon in the first display area AA1.

The pixel electrode 310 may have various shapes, for example, at least a part of an edge of the orthographic projection of the pixel electrode 310 on the substrate 100 have a smooth curve shape so as to avoid the formation of diffraction gap between two adjacent pixel electrodes 310 and improve the display effect of the first display area.

In some other optional embodiments, an orthographic projection of each pixel electrode 310 on the substrate 100 consists of one first graphic unit or two or more first graphic units jointed together, and the first graphic unit includes at least one selected from a group including a round shape, an oval shape, a dumb-bell shape and a gourd shape.

In these optional embodiments, the orthographic projection of the pixel electrode 310 on the substrate 100 is special-shaped, so as to avoid the formation of big diffraction gap between two adjacent first pixels can be avoided and improve the display effect of the first display area.

The pixel electrode 310 may be made of various materials, optionally, the pixel electrode 310 may be a light-transmitting electrode, and the material of the pixel electrode 310 includes a light-transmitting conductive material, so that the light transmittance of the first display area is further improved. Alternatively, the pixel electrode 310 is a reflective electrode, and the material of the pixel electrode 310 includes a reflective metal material such as magnesium-silver alloy. Alternatively, the pixel electrode 310 includes an indium tin oxide layer or an indium zinc oxide layer.

Figure 8:
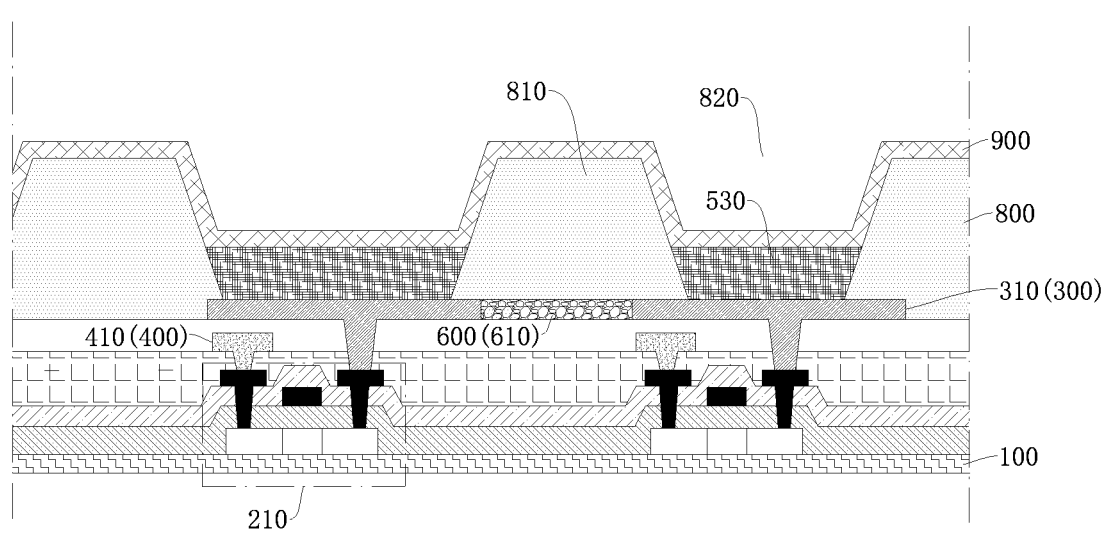
FIG. 8 shows a cross-sectional view at A-A in FIG. 2 in another embodiment.

Referring to FIG. 4 and FIG. 8, FIG. 8 shows a cross-sectional view at A-A in FIG. 2 in another embodiment.

In some other optional embodiments, the display panel 10 further includes a second signal line layer 600 located at a side of the driving layer 200 facing the first electrode layer 300 in the first display area AA1, the second signal line layer 600 includes a plurality of second transparent conducting wires 610; and two or more of the pixel electrodes 310 are connected to a same one of the driving units 210 and are connected to each other by the second transparent conducting wire 610.

In these optional embodiments, when the driving unit 210 is connected to two or more pixel electrodes 310, the two or more pixel electrodes 310 are connected to each other by the second transparent conducting wire 610, so that the driving unit 210 may be connected to any one of the two or more pixel electrodes 310. With the second transparent conducting wire 610, on the one hand, it is convenient for the two or more pixel electrodes 310 to be connected to the driving unit 210, and on the other hand, the effect of the second transparent conducting wire 610 on the light transmittance of the first display area can be reduced.

The second signal line layer 600 may be arranged in various manners, optionally, the second signal line layer 600 is located at a side of the first signal line layer 400 away from the substrate 100, so as to avoid crossing of the first transparent conducting wire 410 and the second transparent conducting wire 610 in the thickness direction and facilitate the arrangement of the first transparent conducting wire 410 and the second transparent conducting wire 610.

Figure 9:
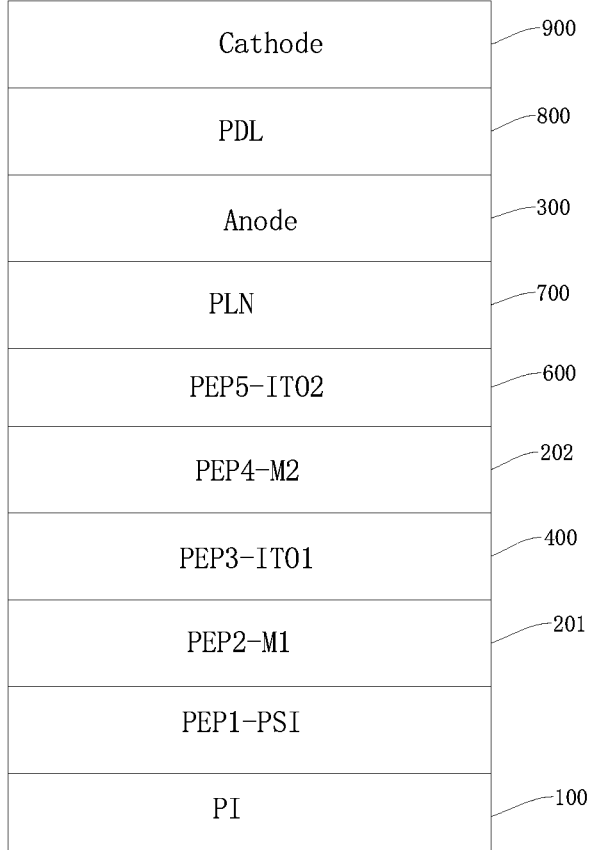
FIG. 9 shows a schematic view of a layer structure of a display panel 10 according to yet another embodiment of a first aspect of the present application.

Referring to FIG. 9, which shows a schematic view of a layer structure of the display panel 10 according to yet another embodiment of the first aspect of the present application.

Optionally, as shown in FIG. 9, if the driver layer 200 includes the first metal layer 201 and the second metal layer 202, the second signal line layer 600 may be located at a side of the second metal layer 202 away from the first metal layer 201, and the first signal line layer 400 is located between the first metal layer 201 and the second metal layer 202.

Figure 10:
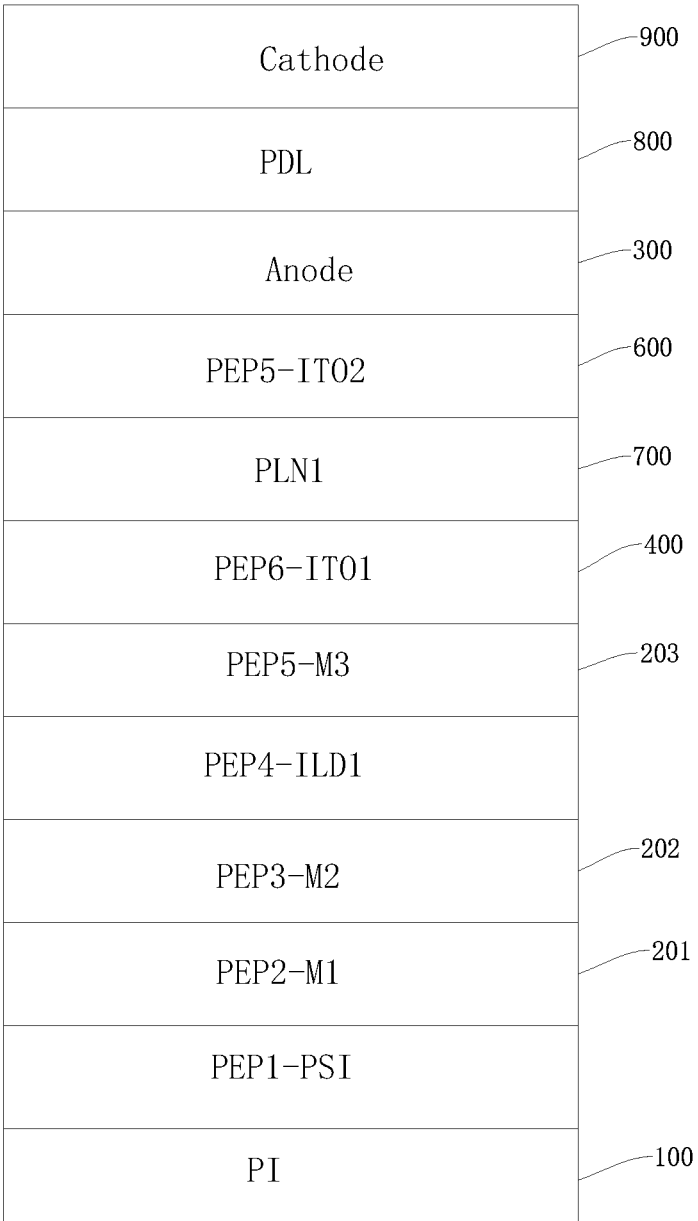
FIG. 10 shows a schematic view of a layer structure of a display panel 10 according to yet another embodiment of a first aspect of the present application.

Referring to FIG. 10, which shows a schematic view of a layer structure of the display panel 10 according to yet another embodiment of the first aspect of the present application.

As shown in FIG. 10, the first signal line layer 400 and the second signal line layer 600 are both located at a side of the third metal layer 203 away from the second metal layer 202. For example, if the display panel 10 further includes a planarization layer 700 located at a side of the third metal layer 203 away from the second metal layer 202, the first signal line layer 400 may be located between the third metal layer 203 and the planarization layer 700, and the second signal line layer 600 is located at a side of the planarization layer 700 away from the third metal layer 203.

Optionally, in other embodiments, if the driving layer 200 includes the first metal layer 201, the second metal layer 202 and the third metal layer 203, the second signal line layer 600 may be located at a side of the third metal layer 203 away from the second metal layer 202, and the first signal line layer 400 is located at a side of the third metal layer 203 facing the second metal layer 202.

Figure 11:
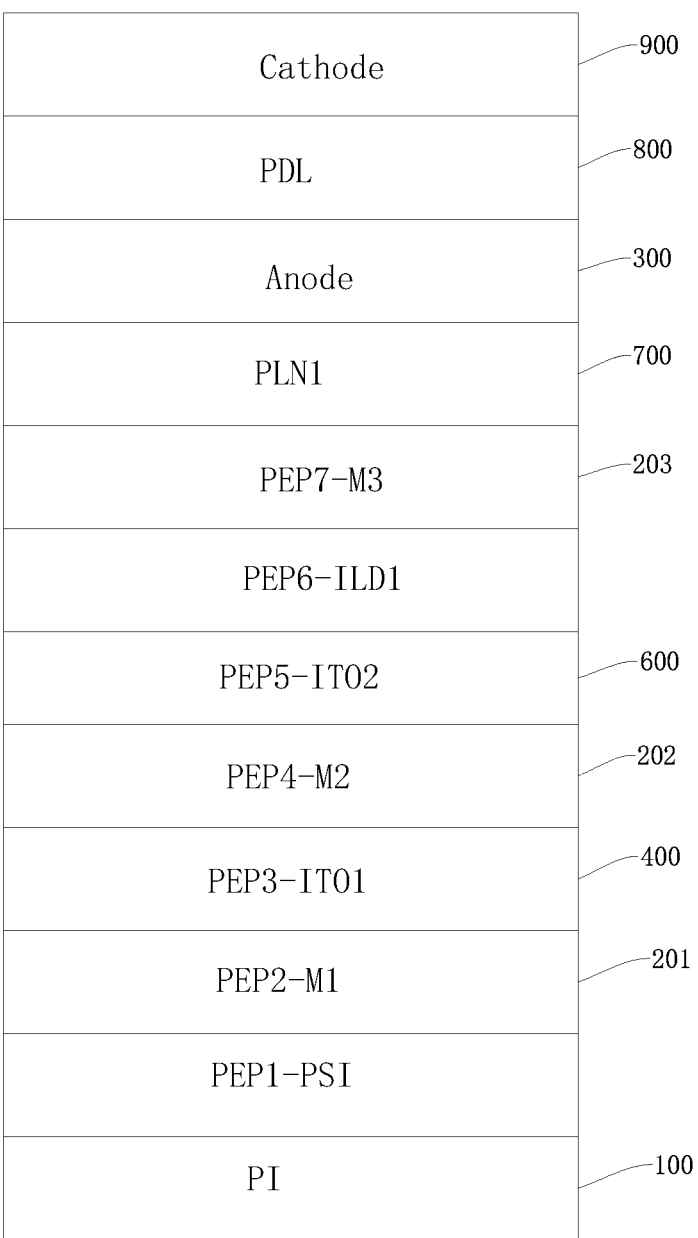
FIG. 11 shows a schematic view of a layer structure of a display panel 10 according to yet another embodiment of a first aspect of the present application.

Optionally, as shown in FIG. 11, if the driving layer 200 includes the first metal layer 201, the second metal layer 202 and the third metal layer 203, the second signal line layer 600 may be located between the third metal layer 203 and the second metal layer 202, and the first signal line layer 400 is located between the second metal layer 202 and the first metal layer 201.

In some optional embodiments, the second signal line layer 600 and the first electrode layer 300 are arranged in a same layer. On the one hand, it is convenient for the first electrodes to be connected to each other by the second transparent conducting wire 610 in the second signal line layer 600, and on the other hand, the increase of thickness of the display panel 10 due to the second signal line layer 600 can be avoided.

When the second signal line layer 600 and the first electrode layer 300 are arranged in a same layer, the second signal line layer 600 and the first electrode layer 300 may be made of a same material, so that the second signal line layer 600 and the first electrode layer 300 can be manufactured in a same manufacturing process, the manufacturing efficiency of the display panel 10 is improved.

Figure 12:
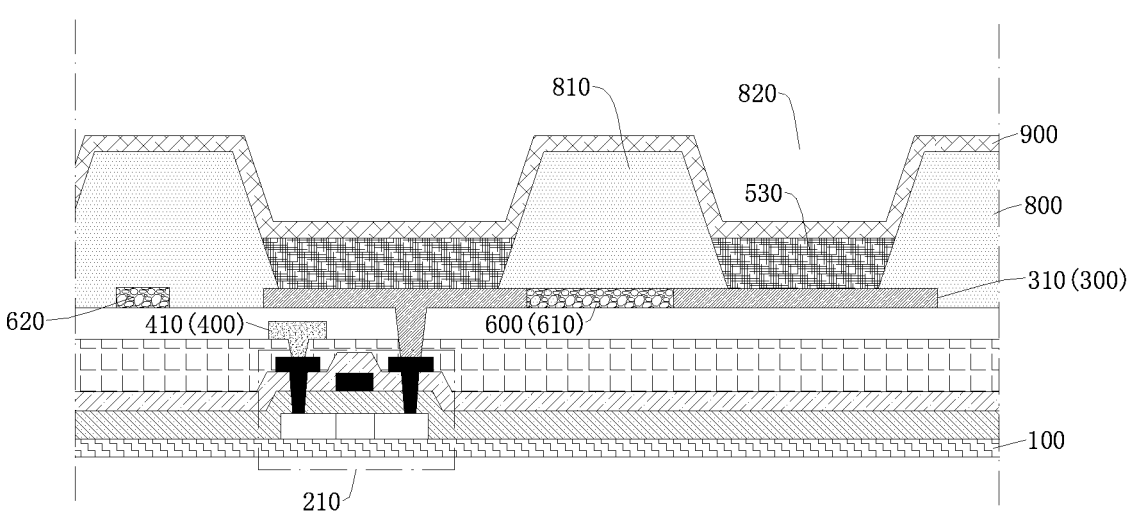
FIG. 12 shows a cross-sectional view at A-A in FIG. 2 in yet another embodiment.

Referring to FIG. 12, which shows a cross-sectional view at A-A in FIG. 2 in yet another embodiment.

Optionally, the second signal line layer 600 further includes third transparent conducting wires 620 for connecting at least two adjacent repeated driving groups 210a, the light transmittance of the first display area can be further increased.

The first transparent conducting wire 410 and the third transparent conducting wire 620 may be arranged in various manners, for example, the first transparent conducting wire 410 is a part of one of a data line and a scanning line, and the third transparent conducting wire 620 is a part of the other of the data line and the scanning line.

For example, the first transparent conducting wire 410 is a part of the data line, and the first transparent conducting wire 410 extends along a first direction and is connected to at least two repeated driving groups 210a that are adjacent along the first direction. The third transparent conducting wire 620 is a part of the scanning line, and the third transparent conducting wire 620 extends along a second direction and is connected to at least two repeated driving groups 210a that are adjacent along the second direction.

The materials of the first transparent conducting wire 410, the second transparent conducting wire 610 and the third transparent conducting wire 620 may be set in various ways, optionally, the first transparent conducting wire 410 includes an indium tin oxide layer or an indium zinc oxide layer, so that the first transparent conducting wire 410 has good conductivity and light transmittance. Optionally, the second transparent conducting wire 610 includes an indium tin oxide layer or an indium zinc oxide layer, so that the second transparent conducting wire 610 has good conductivity and light transmittance. Optionally, the third transparent conducting wire 620 includes an indium tin oxide layer or an indium zinc oxide layer, so that the third transparent conducting wire 620 has good conductivity and light transmittance.

The driving units 210 and the sub-pixels may be arranged in various manners, for example, the driving units 210 and the sub-pixels are arranged in a same manner.

In some other optional embodiments, the plurality of sub-pixels are arranged in rows and columns, the plurality of driving units 210 are arranged in rows and columns, and the sub-pixels have a same arrangement structure as the driving units 210.

The arrangement structure of the sub-pixels refers to an arrangement pattern formed by arranging the sub-pixels according to a certain rule. The arrangement structure of the driving units 210 refers to an arrangement pattern formed by arranging the driving units 210 according to a certain rule.

In these optional embodiments, the driving units 210 and the sub pixels are arranged in the same manner, so that more driving units 210 can be covered by the pixel electrodes 310 to increase the light transmittance of the display panel 10.

Figure 13:
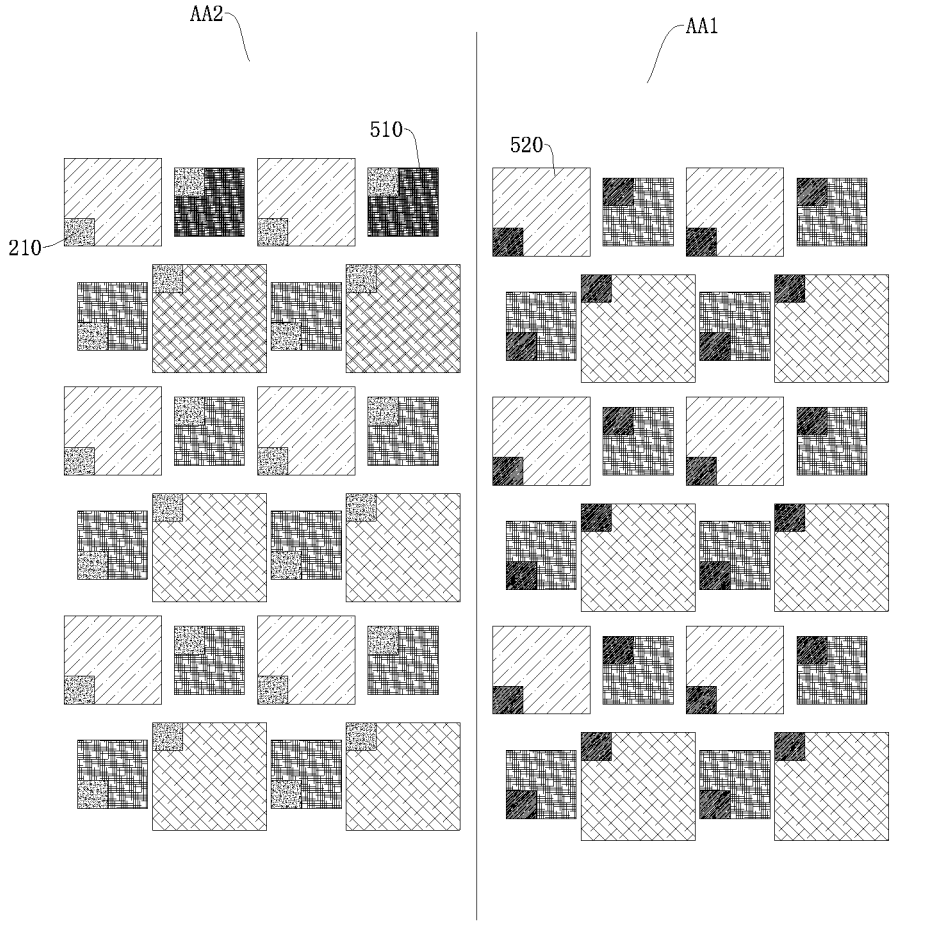
FIG. 13 shows a top view of a part of a layer structure of a display panel according to another embodiment of a first aspect of the present application.

Referring to FIG. 13, in some optional embodiments, the plurality of driving units 210 are arranged in rows and columns, and the driving units 210 are arranged in a curved or waved path along at least one of a row direction and a column direction. For example, the driving units 210 are arranged in rows and columns along the horizontal direction and the vertical direction in the figure, and the driving units 210 are arranged in a waved path along the horizontal direction. Alternatively, the driving units 210 are arranged in a waved path along vertical direction. Alternatively, the driving units 210 are arranged in a waved path along both the horizontal direction and the vertical direction. The diffraction gap between two adjacent rows or two adjacent columns of the driving units 210 can be avoided, the diffraction phenomenon is reduced.

Optionally, an area of an orthographic projection of the driving unit 210 on the substrate 100 is less than or equal to a half of a pixel size. The size of the driving unit 210 is small, so that the light transmittance of the display panel 10 can be further increased.

The pixel size refers to a size of a single sub-pixel and may be averaged, for example, the pixel size is calculated by dividing the area of the display panel by the number of pixels.

Exemplarily, the display panel 10 may further include an encapsulation layer located at a side of the second electrode layer 900 away from the first electrode layer 300, and a polarizer and a cover plate that are located on the encapsulation layer; or the cover plate may be arranged directly on the encapsulation layer without the polarizer; or the cover plate may be at least arranged directly on the encapsulation layer in the first display area without the polarizer, so as to prevent the polarizer from affecting the light collection amount of the photosensitive component arranged under the first display area. Of course, the polarizer may also be arranged on the encapsulation layer in the first display area.

A second aspect of the embodiments of the present application further provides a display apparatus which may include the display panel 10 according to any of the above embodiments. A display apparatus of an embodiment will be illustrated below as an example, in which the display apparatus includes the display panel 10 according to the above embodiments.

Figure 14:
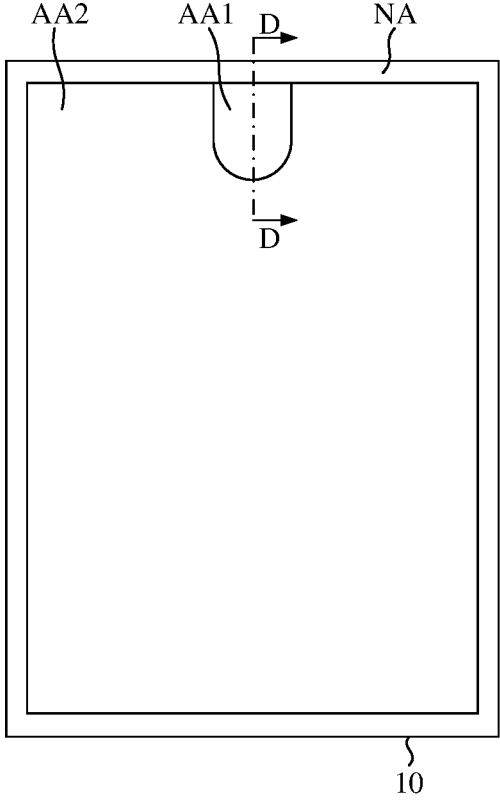
FIG. 14 shows a schematic structural diagram of a display apparatus according to an embodiment of a second aspect of the present application.
Figure 15:
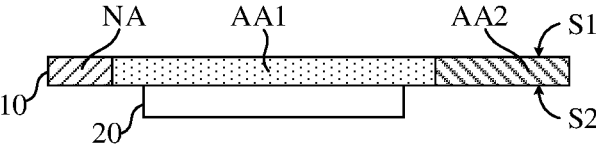
FIG. 15 shows a cross-sectional view at D-D in FIG. 14.

FIG. 14 shows a top schematic view of a display apparatus according to an embodiment of the present application, and FIG. 15 shows a cross-sectional view at D-D in FIG. 14. In the display apparatus according to the embodiment, the display panel 10 may be the display panel 10 according to any of the above embodiments of the first aspect, the display panel 10 includes the first display area and the second display area, and the light transmittance of the first display area is greater than the light transmittance of the second display area.

The display panel 10 includes a first surface S1 and a second surface S2 opposing to each other, in which the first surface S1 is a display surface. The display apparatus further includes a photosensitive component 20 located at a side corresponding to the second surface S2 of the display panel 10, and the photosensitive component 20 corresponds to the location of the first display area.

The photosensitive component 20 may be an image capturing apparatus for capturing external image information. In the embodiment, the photosensitive component 20 is a complementary metal oxide semiconductor (Complementary Metal Oxide Semiconductor, CMOS) image capturing apparatus, and in some other embodiments, the photosensitive component 20 may also be other image capturing apparatus such as a charge-coupled device (Charge-coupled Device, CCD) image capturing apparatus. The photosensitive component 20 may not be limited to an image capturing apparatus. For example, in some embodiments, the photosensitive component 20 may also be a light sensor such as an infrared sensor, a proximity sensor, an infrared lens, a flood light sensing element, an ambient light sensor and a dot projector. In addition, other components such as a telephone receiver and a speaker may also be integrated on the second surface S2 of the display panel 10 of the display apparatus.

According to the display apparatus of the embodiments of the present application, the light transmittance of the first display area is greater than the light transmittance of the second display area, so that the photosensitive component 20 can be integrated on the rear of the first display area of the display panel 10. An under-screen integration is achieved for the photosensitive component 20 such as an image capturing apparatus, and moreover, the first display area can display the image, the display area of the display panel 10 is increased and a full-screen design is achieved for the display apparatus.

The above embodiments of the present application do not exhaustively describe all the details, nor do they limit the present application only to the specific embodiments. Obviously, according to the above description, many modifications and changes can be made. These embodiments are selected and specifically described in the specification to better explain the principles and practical applications of the present application, so that those skilled in the art can make good use of the present application and make modifications based on the present application. The present application is limited only by the claims and full scope and equivalents thereof.

What is claimed is:

1. A display panel, comprising:

a substrate;

a driving layer arranged on the substrate and comprising a plurality of driving units;

a first electrode layer arranged on a side of the driving layer away from the substrate and comprising a plurality of pixel electrodes distributed in an array, each of the driving units being electrically connected to at least one of the pixel electrodes, and at least a part of an orthographic projection of at least a part of the driving units on the substrate being located within an orthographic projection of the pixel electrodes on the substrate;

a first signal line layer arranged between the first electrode layer and the substrate and comprising a plurality of first transparent conducting wires, and at least two of the driving units being connected to each other by a first one of the first transparent conducting wires; and a plurality of pixel units arranged in an array, each of the pixel units comprising two or more sub-pixels, a corresponding sub-pixel being arranged on each of the pixel electrodes, the driving units corresponding to a plurality of sub-pixels in at least one of the pixel units belong to a repeated driving group, and at least two repeated driving groups being connected to each other by a second one of the first transparent conducting wire; and a second signal line layer located at a side of the driving layer facing the first electrode layer and comprising a plurality of second transparent conducting wires, and two or more of the pixel electrodes being connected to a same one of the driving units and being connected to each other by the second transparent conducting wire.

2. The display panel according to claim 1, wherein the same one of the driving units is electrically connected to two or more of the pixel electrodes to drive two or more of the sub-pixels to display by the driving unit.

3. The display panel according to claim 1, wherein the second signal line layer is located at a side of the first signal line layer away from the substrate.

4. The display panel according to claim 1, wherein the driving layer comprises a first metal layer and a second metal layer arranged in sequence along a direction away from the substrate, the first signal line layer is located between the first metal layer and the second metal layer; or the first signal line layer is located at a side of the second metal layer away from the substrate; or the first signal line layer is located between the first metal layer and the second metal layer, and the second signal line layer is located at a side of the second metal layer away from the substrate; or the first signal line layer is located at a side of the second metal layer away from the substrate, and the second signal line layer is located at a side of the first signal line layer away from the substrate.

5. The display panel according to claim 1, wherein the driving layer comprises a first metal layer, a second metal layer and a third metal layer arranged in sequence along a direction away from the substrate, the first signal line layer is located between the first metal layer and the second metal layer, or the first signal line layer is located between the second metal layer and the third metal layer, or the first signal line layer is located at a side of the third metal layer away from the second metal layer.

6. The display panel according to claim 5, wherein the second signal line layer is located at a side of the third metal layer away from the second metal layer, the first signal line layer is located at a side of the third metal layer facing the second metal layer; or both of the first signal line layer and the second signal line layer are located at a side of the third metal layer away from the second metal layer; or the second signal line layer is located between the second metal layer and the third metal layer, the first signal line layer is located between the first metal layer and the second metal layer.

7. The display panel according to claim 5, further comprising a planarization layer located between the first electrode layer and the third metal layer, the first signal line layer being located at a side of the planarization layer facing the driving layer, and the second signal line layer being located at a side of the planarization layer facing the first electrode layer.

8. The display panel according to claim 1, wherein the second signal line layer and the first electrode layer are arranged in a same layer.

9. The display panel according to claim 1, wherein the second one of the first transparent conducting wire extends along a first direction and is connected to the at least two repeated driving groups that are adjacent along the first direction, and the second signal line layer further comprises third transparent conducting wires, each of the third transparent conducting wires extends along a second direction and is connected to another at least two repeated driving groups that are adjacent along the second direction.

10. The display panel according to claim 9, wherein the first transparent conducting wire is a part of one of a data line and a scanning line, and the third transparent conducting wire is a part of the other of the data line and the scanning line.

11. The display panel according to claim 1, wherein the repeated driving group comprises a first driving block and a second driving block, the first driving block comprises at least two of the driving units, the second driving block comprises at least one of the driving units in the repeated driving group other than the first driving block, a distance between adjacent two of the driving units in the first driving block is less than a distance between the first driving block and the second driving block, and the first driving block and the second driving block are connected to each other by the first transparent conducting wire.

12. The display panel according to claim 11, wherein an orthographic projection of at least a part of the first driving blocks on the substrate is located within an orthographic projection of one of the plurality of pixel electrodes on the substrate, and an orthographic projection of at least a part of the second driving blocks on the substrate is located within an orthographic projection of another of the plurality of pixel electrodes on the substrate.

13. The display panel according to claim 1, comprising a first display area and a second display area, a light transmittance of the first display area being greater than a light transmittance of the second display area, and the first signal line layer being located in the first display area.

14. The display panel according to claim 13, wherein an orthographic projection of a pixel electrode in the first display area on the substrate and an orthographic projection of a pixel electrode in the second display area on the substrate are of a same area but different shapes.

15. The display panel according to claim 1, wherein the plurality of pixel electrodes are arranged in rows and columns, the plurality of driving units are arranged in rows and columns, and the driving units have a same arrangement structure as the pixel electrodes, so that the driving units are covered by the pixel electrodes; or the plurality of driving units are arranged in rows and columns, and the driving units are arranged in a curved or waved path along at least one of a row direction and a column direction.

16. The display panel according to claim 1, wherein an area of an orthographic projection of the driving unit on the substrate is less than or equal to a half of a pixel size.

17. A display apparatus, comprising the display panel according to claim 1.

* * * * *